(12) United States Patent
Rhee

(10) Patent No.: US 9,252,346 B2
(45) Date of Patent: Feb. 2, 2016

(54) SEMICONDUCTOR DEVICE HAVING ELECTRODE INTERCONNECTIONS WITHIN A CONDUCTIVE ADHESIVE

(71) Applicant: LG Electronics Inc., Seoul (KR)

(72) Inventor: Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/463,452

(22) Filed: Aug. 19, 2014

(65) Prior Publication Data
US 2015/0054019 A1 Feb. 26, 2015

(30) Foreign Application Priority Data
Aug. 21, 2013 (KR) ........................ 10-2013-0099144

(51) Int. Cl.
*H01L 27/15* (2006.01)
*H01L 29/267* (2006.01)
(Continued)

(52) U.S. Cl.
CPC . *H01L 33/62* (2013.01); *C09J 9/02* (2013.01); *H01L 24/29* (2013.01); *H01L 24/83* (2013.01); *H01L 23/4828* (2013.01); *H01L 23/4922* (2013.01); *H01L 23/5328* (2013.01); *H01L 24/32* (2013.01); *H01L 24/81* (2013.01);
(Continued)

(58) Field of Classification Search
CPC ....... H01L 33/36; H01L 33/38; H01L 33/387; H01L 23/4922; H01L 23/4828; H01L 23/5328; H01L 23/482; H01L 2224/8385; H01L 2224/83851; H01L 2224/8085; H01L 51/5246; H01L 2021/60277; H01L 21/76885; H01L 2225/1058; H01L 2224/065; H01L 2224/06517; H01L 2224/26; H01L 2224/40491; H01L 2224/48491; H01L 24/06; H01L 24/26; H01L 2924/156; H01L 2924/35; H01L 2924/36; H01L 33/62; H01L 2224/29355; H01L 2224/29386; H01L 2224/29644; H01L 2224/29655; H01L 2224/1411; H01L 2224/2929; H01L 2224/29561; H01L 2224/81191; H01L 2224/83192; H01L 2224/48091; H01L 24/29; H01L 24/32; H01L 24/81; H01L 24/83; H01L 24/91; H01L 2924/00014; H01L 2924/01079; H01L 2924/14; H01L 2924/01078; H01L 2924/01029; C09J 9/02
USPC ............ 257/81, 99, 433, 672, 690, 692, 693, 257/700, 773, 776, 786, 731, 668, 783; 361/751
See application file for complete search history.

(56) References Cited

U.S. PATENT DOCUMENTS 5,332,869 A * 7/1994 Hagiwara ...................... 174/257
5,688,584 A * 11/1997 Casson et al. ................. 428/209
(Continued)

FOREIGN PATENT DOCUMENTS

JP 61290780 A * 12/1986 .............. H01L 33/00
JP 03062533 A * 3/1991 .............. H01L 21/60
(Continued)

*Primary Examiner* — Teresa M Arroyo
(74) *Attorney, Agent, or Firm* — Birch, Stewart, Kolasch & Birch, LLP

(57) ABSTRACT

A semiconductor device includes an electrode including a plurality of pillars, a semiconductor element configured to be electrically-connected with the electrode, a substrate having electrode patterns, and a conductive adhesive layer located between the substrate and the electrode, the conductive adhesive layer including conductive substances configured to electrically-connect the pillars and the electrode patterns to each other, and including a body which encloses the conductive substances.

16 Claims, 6 Drawing Sheets

(51) Int. Cl.
*H01L 33/00* (2010.01)
*H01L 31/0203* (2014.01)
*H01L 23/495* (2006.01)
*H01L 23/48* (2006.01)
*H01L 23/52* (2006.01)
*H01L 23/12* (2006.01)
*H01L 29/40* (2006.01)
*H01L 33/62* (2010.01)
*C09J 9/02* (2006.01)
*H01L 23/00* (2006.01)
*H01L 33/36* (2010.01)
*H01L 51/52* (2006.01)
*H01L 33/38* (2010.01)
*H01L 23/482* (2006.01)
*H01L 23/532* (2006.01)
*H01L 23/492* (2006.01)

(52) U.S. Cl.
CPC ............... *H01L 24/91* (2013.01); *H01L 33/36* (2013.01); *H01L 33/38* (2013.01); *H01L 51/5246* (2013.01); *H01L 2224/1411* (2013.01); *H01L 2224/2929* (2013.01); *H01L 2224/29355* (2013.01); *H01L 2224/29386* (2013.01); *H01L 2224/29561* (2013.01); *H01L 2224/29644* (2013.01); *H01L 2224/29655* (2013.01); *H01L 2224/81191* (2013.01); *H01L 2224/83192* (2013.01); *H01L 2224/83851* (2013.01); *H01L 2225/1058* (2013.01); *H01L 2924/156* (2013.01); *H01L 2924/35* (2013.01); *H01L 2924/36* (2013.01)

(56) References Cited

U.S. PATENT DOCUMENTS

| | | | | |
|---|---|---|---|---|
| 6,246,014 | B1 * | 6/2001 | Pommer | 174/261 |
| 6,383,327 | B1 * | 5/2002 | Mase | 156/291 |
| 6,538,309 | B1 * | 3/2003 | Hotta et al. | 257/678 |
| 6,597,070 | B2 * | 7/2003 | Miyazaki | 257/778 |
| 6,690,580 | B1 * | 2/2004 | Goldberg et al. | 361/735 |
| 6,739,761 | B2 * | 5/2004 | Tsukamoto et al. | 385/89 |
| 6,771,348 | B2 * | 8/2004 | Oh et al. | 349/152 |
| 6,798,072 | B2 * | 9/2004 | Kajiwara et al. | 257/778 |
| 8,138,502 | B2 | 3/2012 | Nakamura et al. | |
| 2003/0016715 | A1 | 1/2003 | Furukawa et al. | |
| 2004/0080048 | A1 | 4/2004 | Haruta et al. | 257/741 |
| 2004/0241932 | A1 * | 12/2004 | Souriau et al. | 438/222 |
| 2005/0211464 | A1 * | 9/2005 | Byun et al. | 174/259 |
| 2007/0029554 | A1 | 2/2007 | Nakamura et al. | |
| 2007/0185243 | A1 * | 8/2007 | Terada et al. | 523/457 |
| 2009/0075025 | A1 * | 3/2009 | Ozono et al. | 428/120 |
| 2009/0185393 | A1 | 7/2009 | Kang et al. | |
| 2009/0236127 | A1 * | 9/2009 | Kobae | 174/255 |
| 2009/0246474 | A1 * | 10/2009 | Sakurai et al. | 428/172 |
| 2011/0267791 | A1 * | 11/2011 | Tomisaka et al. | 361/783 |
| 2013/0017631 | A1 * | 1/2013 | Takeda et al. | 438/26 |
| 2013/0168679 | A1 * | 7/2013 | Park et al. | 257/59 |

FOREIGN PATENT DOCUMENTS

| | | | | |
|---|---|---|---|---|
| JP | 06018909 A | * | 1/1994 | ............ G02F 1/1345 |
| KR | 10-0907576 B1 | | 7/2009 | |
| KR | 10-2012-0021472 A | | 3/2012 | |

\* cited by examiner

SEMICONDUCTOR DEVICE HAVING ELECTRODE INTERCONNECTIONS WITHIN A CONDUCTIVE ADHESIVE

CROSS-REFERENCE TO RELATED APPLICATIONS

Pursuant to 35 U.S.C. §119(a), this application claims the benefit of earlier filing date and right of priority to Korean Patent Application No. 10-2013-0099144, filed on Aug. 21, 2013, the contents of which is incorporated by reference herein in its entirety.

BACKGROUND OF THE INVENTION

1. Field of the Invention

The present disclosure relates to a semiconductor device.

2. Description of the Related Art

Generally, an electrical connection between a circuit board and a microchip using a semiconductor mounting technique may be made by an anisotropic conductive film (ACF). The anisotropic conductive film is an interconnecting material used when a circuit board and a microchip cannot be attached to each other by soldering due to a specific material of the circuit board, or due to a fine pitch of a signal line. That is, an electrode of the microchip and an electrode of the circuit board are formed to have a minute pitch interval therebetween. This may cause difficulty in attaching the microchip and the circuit board by soldering, etc. Accordingly, an anisotropic conductive film (ACF), which is configured to electrically-connect a circuit board and a microchip of a semiconductor device to each other, has been used.

Such ACF is configured as a thin film, which has the same area as an adhesive layer, and is formed on one surface or two surfaces of the adhesive layer. The adhesive layer is formed as an adhesive, which is hardened by heat, and is mixed with conductive balls. Once pressure of a high temperature is applied to the adhesive layer, the conductive balls of the adhesive layer, which correspond to part to which a pad of a circuit board has contacted, are destroyed. The destroyed conductive balls serve to conduct pads, e.g., an ITO electrode of an LCD panel and an electrode of an FPC. The rest adhesive is filled and hardened in concavo-convex parts rather than the pads, thereby adhering the LCD panel and the FPC to each other in an insulated state.

Recently, the ACF is being widely used as an interconnecting material of an LCD panel. Further, the ACF is being widely used in mounting technique for connecting a driver IC chip for an LCD device used in a portable phone or a computer, with an LCD panel.

SUMMARY OF THE INVENTION

Therefore, an aspect of the detailed description is to provide a semiconductor device capable of minimizing electrical separation between an electrode and electrode patterns of a substrate, the electrical separation due to pressure applied to a conductive adhesive layer.

To achieve these and other advantages and in accordance with the purpose of this specification, as embodied and broadly described herein, there is provided a semiconductor device, comprising: an electrode including a plurality of pillars; a semiconductor element configured to be electrically-connected with the electrode; a substrate having electrode patterns; and a conductive adhesive layer located between the substrate and the electrode, the conductive adhesive layer including conductive substances configured to electrically-connect the pillars and the electrode patterns to each other, and including a body which encloses the conductive substances.

A thickness of the conductive adhesive layer may be the sum of a minimized distance and a height of the pillars, the minimized distance for electrically-connecting the pillars and the electrode patterns to each other.

A width of the conductive adhesive layer may be within the range of 1 cm to 6 cm.

The body of the conductive adhesive layer may be formed to enclose the plurality of pillars.

At least one of the plurality of pillars may be formed to contact the conductive substances.

The plurality of pillars may have the same distance therebetween.

A thickness of the conductive adhesive layer may be obtained by the following formula:

$$T=(1-(Ea/Ra))*h \qquad \text{[Formula]}$$

where 'T' denotes a thickness of the conductive adhesive layer, and 'Ea' denotes an area of the pillars in a horizontal direction. 'Ra' denotes an area of the conductive adhesive layer in a horizontal direction, and 'h' denotes a height of the pillars.

Each of the plurality of pillars may have the same volume.

The electrode patterns may be protruded from the substrate so as to face the pillars. The electrode patterns may be protruded from the substrate, to form pillars shorter than the pillars of the electrode.

The present invention can have the following advantages.

Firstly, as the electrode includes the plurality of pillars, the electrode can be stably adhered to the conductive adhesive layer.

Secondly, as the electrode includes the plurality of pillars, the electrode can be electrically-connected to the conductive substances inside the conductive adhesive layer.

Thirdly, as the body of the conductive adhesive layer is arranged to enclose the plurality of pillars, a stable adhesive property can be implemented.

Fourthly, as the electrode includes the plurality of pillars and the plurality of pillars have the same length or the same interval therebetween, the electrode can be stably adhered to the conductive adhesive layer.

Fifthly, as the electrode includes the plurality of pillars, the electrode and the electrode patterns can be electrically-connected to each other in the conductive adhesive layer, even if the conductive adhesive layer has a very wide area.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE INVENTION

Figure 1:
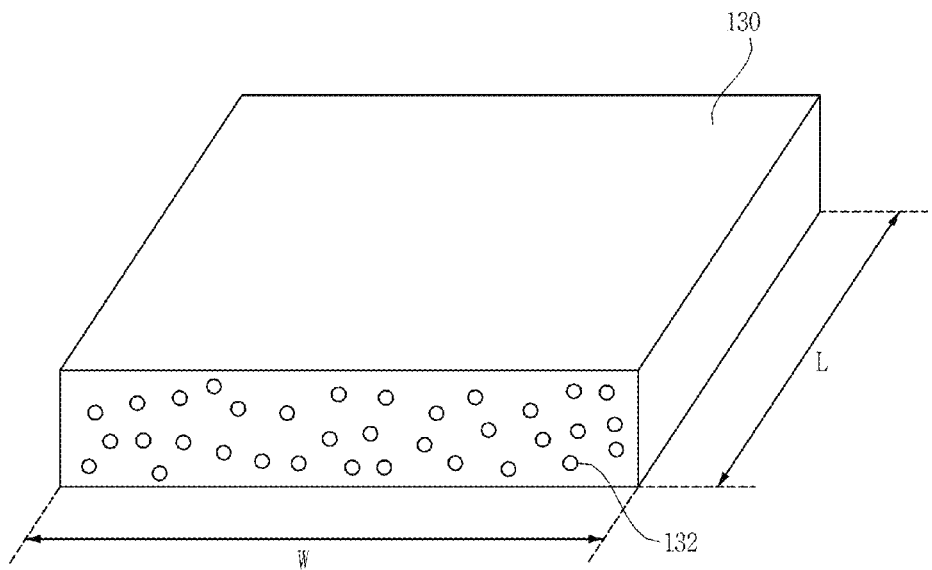
FIG. 1 is a perspective view of a conductive adhesive layer of a semiconductor device according to an embodiment of the present invention.

Various modifications and embodiments can be made in the present invention, and reference will be made in detail to the preferred embodiments of the present invention, examples of which are illustrated in the accompanying drawings. However, it should also be understood that embodiments are not limited by any of the details of the foregoing description, but rather should be construed broadly within its spirit and scope and it is intended that the present invention cover modifications and variations of this invention provided they come within the scope of the appended claims and their equivalents. For the sake of brief description with reference to the drawings, the same or equivalent components will be provided with the same reference numbers, and description thereof will not be repeated.

Terms used in the present invention is to merely explain specific embodiments, thus it is not meant to be limiting. A singular expression includes a plural expression except that two expressions are contextually different from each other. In the present invention, a term "comprises" or "comprising" is intended to indicate that characteristics, figures, steps, operations, components, elements disclosed on the specification or combinations thereof exist. Rather, the term "comprises" or "comprising" should be understood so as not to pre-exclude existence of one or more other characteristics, figures, steps, operations, components, elements or combinations thereof or additional possibility.

In the drawings, a thickness and a size of each layer are exaggerated, omitted, or schematically expressed, for convenience and accuracy. A size and an area of each component are not completely consistent with a substantial size or a substantial area.

Hereinafter, a semiconductor device according to the present invention will be explained in more detail with reference to the attached drawings.

FIG. 1 is a perspective view of a conductive adhesive layer 130 of a semiconductor device according to an embodiment of the present invention.

The conductive adhesive layer 130 may be a layer having an adhesive property and conductivity. For this, a material having conductivity and a material having an adhesive property may be mixed with each other in the conductive adhesive layer 130. The conductive adhesive layer 130 may have flexibility, and may allow a display device to have a flexible function.

For instance, the conductive adhesive layer 130 may be implemented as an anisotropic conductive film (ACF), an anisotropic conductive paste, a solution including conductive particles, etc. The conductive adhesive layer 130 may be configured as a layer having conductivity in a Z-direction (thickness direction), and having an electrical insulation property in X-Y directions (horizontal direction). Accordingly, the conductive adhesive layer 130 may be called a 'Z'-axis conductive layer (hereinafter, will be referred to as a 'conductive adhesive layer').

The anisotropic conductive film (ACF) is formed as an anisotropic conductive medium mixed with an insulating base member. Once heat and pressure are applied to the ACF, only a specific part of the ACF becomes conductive by the anisotropic conductive medium. Hereinafter, the present invention will be explained under an assumption that both heat and pressure are applied to the ACF. However, only one of heat and pressure may be applied to the ACF, or the ACF may undergo a UV hardening process.

The anisotropic conductive medium may be conductive balls or conductive particles. In this embodiment, the ACF is a film formed as conductive balls mixed with an insulating base member. If heat and pressure are applied to the ACF, only a specific part of the ACF has conductivity by the conductive balls. The ACF may contain a plurality of particles formed by coating conductive cores with an insulating layer formed of a polymer material. Once heat and pressure are applied to the ACF, the insulating layer of the ACF is destroyed at a part to which the heat and pressure have been applied, and the ACF has conductivity by the core. The core may be transformed to implement a layer having both surfaces to which objects contact, in a thickness direction of the ACF. More specifically, as heat and pressure are entirely applied to the ACF, an electrical connection is partially made in a Z-direction of the ACF, due to a height difference between objects adhered to each other by the ACF.

Alternatively, the ACF may contain a plurality of particles formed by coating insulating cores with a conductive material. In this case, the conductive material is transformed at a part to which heat and pressure have been applied, and the ACF has conductivity in a thickness direction. Still alternatively, the ACF may have conductivity in a thickness direction as a conductive material passes through an insulating base member in a Z-direction. In this case, the conductive material may have a sharp end portion.

The ACF may be a fixed array ACF formed as conductive balls inserted into one surface of an insulating base member. More specifically, the insulating base member is formed of a material having an adhesive property. The conductive balls are arranged at a bottom portion of the insulating base member in a concentrative manner. Once heat and pressure are applied to the insulating base member, the insulating base member is transformed together with the conductive balls to thus have conductivity in a vertical direction.

However, the present invention is not limited to this. That is, the ACF may be implemented as conductive balls mixed with an insulating base member at random. Alternatively, the ACF may be implemented as a double ACF that conductive balls are arranged on one of a plurality of layers.

The anisotropic conductive paste is formed as a paste and conductive balls that are combined with each other, which may be a paste formed as conductive balls have been mixed with a base material having an insulation property and an adhesive property. The solution containing conductive particles may be a solution containing conductive particles or nano particles.

As shown in FIG. 1, the conductive adhesive layer 130 may include conductive substances 132 having an electrical conductive property. The conductive substances 132 may be arranged in a body of the conductive adhesive layer 130, the body having viscosity.

In this embodiment, the conductive adhesive layer 130 may be an anisotropic conductive film (ACF) formed of an adhesive resin mixture including the conductive substances 132.

The body of the conductive adhesive layer 130, which has viscosity, may be formed of a resin mixture. For instance, the conductive adhesive layer 130 may include silicone (Si), resin, epoxy or acryl resin. The body of the conductive adhesive layer 130, which has viscosity, may have an electrical insulating property. The conductive adhesive layer 130 may have a position change according to pressure applied to the conductive substances 132. The conductive substances may be arranged in the body of the conductive adhesive layer 130 in a regular or irregular manner.

The conductive adhesive layer 130 controls a size, a shape, a charging amount, a distribution state, a thickness, etc. of the conductive substances 132, and conductivity of the conductive adhesive layer 130 may be variable. A thermal conductivity, an adhesive property, fluidity, etc. of the conductive adhesive layer 130 may be changed as the amount of the conductive substances 132 is increased.

The conductive adhesive layer 130 may have an adhesive force. The conductive adhesive layer 130 may include a thermoplastic adhesive such as styrene-based block copolymer. However, the present invention is not limited to this. In another embodiment, the conductive adhesive layer 130 may include a thermosetting adhesive such as epoxy resin. The conductive adhesive layer 130 may have its adhesive force controlled by having a thickness, an adhesive property, fluidity, an adhesive force, impurities, an elastic force thereof controlled.

The conductive substances 132 may be formed of metallic particles such as nickel, or may be formed of particles obtained by melt-plating resin. However, the materials of the conductive substances 132 are not limited to such materials. If the conductive substances 132 are formed of particles obtained by melt-plating resin, the conductive substances 132 may be obtained by coating conductive substances such as nickel or gold on the surface of a polymer material such as polystyrene resin or acryl resin.

Fluidity of the body of the conductive adhesive layer 130 may be changed according to a width (W) and a length (L) of the conductive adhesive layer 130 in a horizontal direction. If the conductive adhesive layer 130 has an increased area, fluidity of the body may be decreased.

Figure 2:
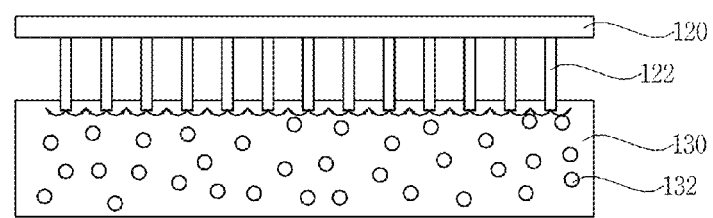
FIGS. 2 to 4 are views illustrating an adhered state between an electrode and a conductive adhesive layer of a semiconductor device according to an embodiment of the present invention.
Figure 3:
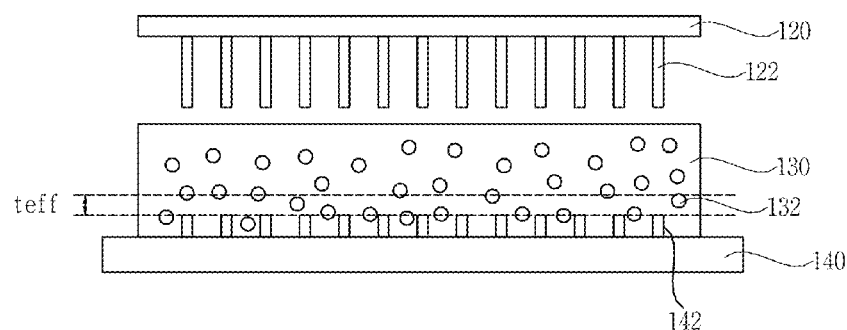
Figure 4:
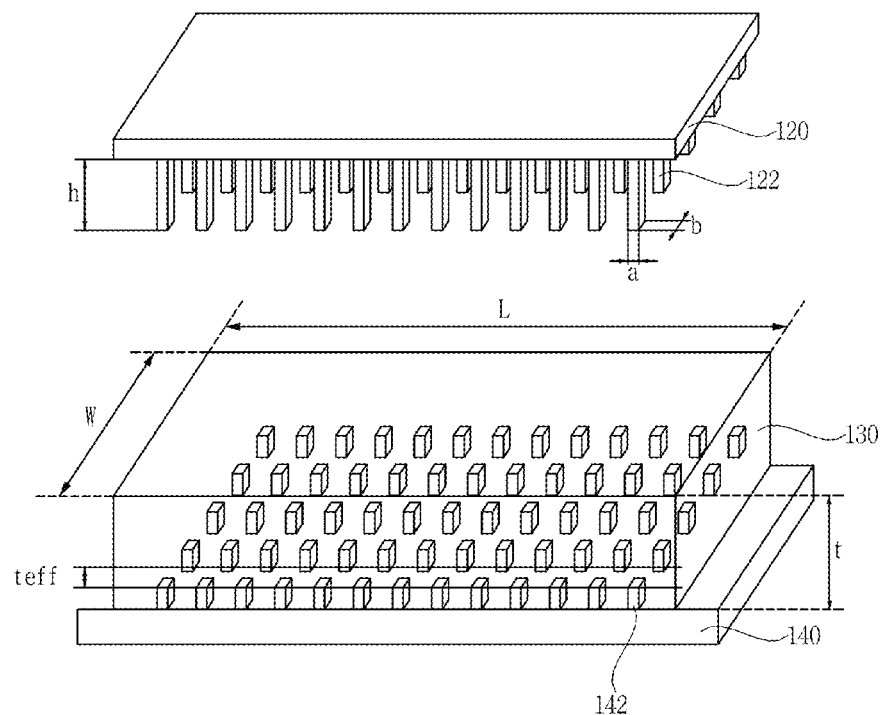

FIGS. 2 to 4 are views illustrating an adhered state between an electrode and a conductive adhesive layer of a semiconductor device according to an embodiment of the present invention.

Referring to FIG. 2, in the semiconductor device according to an embodiment of the present invention, an electrode 120 electrically-connected to the semiconductor device may include a plurality of pillars 122 having the same length.

The pillars 122 may be integrally formed with the electrode 120. Alternatively, the pillars 122 may be separately formed from the electrode 120, and then may be adhered to the electrode 120.

The electrode 120 may include a material having an electrical conductivity. For instance, the electrode 120 may include at least one metallic material among In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi. Alternatively, the electrode 120 may include an alloy of at least two metallic materials. The electrode 120 may be formed in a single layer or multiple layers.

The pillars 122 may be inserted into the conductive adhesive layer 130. The pillars 122 may have a volume large enough to be introduced into the conductive adhesive layer 130. The body of the conductive adhesive layer 130 may be arranged between the pillars 122.

The body of the conductive adhesive layer 130 may have fluidity. In a case where the plurality of pillars 122 is inserted into the body of the conductive adhesive layer 130, the body may be arranged between the plurality of pillars 122.

Referring to FIG. 3, the conductive adhesive layer 130 may have a minimized distance ($t_{\it eff}$) for electrically-connecting the pillars 122 and electrode patterns 142 of a substrate 140 with each other.

If a distance between a lower surface of the pillars 122 and an upper surface of the electrode patterns 142 of the substrate 140 is equal to or shorter than the minimized distance ($t_{\it eff}$), the electrode 120 and the electrode patterns 142 may be conducted to each other.

The electrode patterns 142 of the substrate 140 may be inserted into the conductive adhesive layer 130. The electrode patterns 142 of the substrate may be formed in plurality. In this case, each of the plurality of electrode patterns 142 of the substrate 140 may have the same volume.

Referring to FIG. 4, the plurality of pillars 122 may have a width (a) and a length (b) in a horizontal direction, and a height (h) in a vertical direction.

A thickness of the conductive adhesive layer 130 may be the sum of the minimized distance ($t_{\it eff}$) and the height (h) of the pillars 122.

A width (W) of the conductive adhesive layer 130 may be within the range of 1 cm~6 cm. An adhesive force of the conductive adhesive layer 130 may be proportional to a value obtained by multiplying a thickness of the body of the conductive adhesive layer 130 by an area of the body. If the width of the conductive adhesive layer 130 is less than 1 cm, an adhesive force of the conductive adhesive layer 130 may be lowered to a value lower than a reference value. This may cause the electrode 120 and the conductive adhesive layer 130 to have an inferior adhered state therebetween. If the width of the conductive adhesive layer 130 is more than 6 cm, fluidity of the conductive adhesive layer 130 is significantly degraded. As a result, it is difficult for the pillars 122 to be inserted into the conductive adhesive layer 130. This may cause a problem in electrically conductivity between the electrode 120 and the electrode patterns 142.

The body of the conductive adhesive layer 130 may be formed to enclose the plurality of pillars 122. Each of the plurality of pillars 122 may have the same volume. The plurality of pillars 122 may have the same distance therebetween. The thickness of the conductive adhesive layer 130 may be related to an area of the pillars 122 in a horizontal direction. The area of the pillars 122 in a horizontal direction may be determined based on the width of the conductive adhesive layer 130.

The thickness of the conductive adhesive layer 130 may be obtained by the following formula:

$$T = (1 - (Ea/Ra)) * h \qquad \text{[Formula]}$$

where 'T' denotes a thickness of the conductive adhesive layer 130, and 'Ea' denotes an area of the pillars 122 in a horizontal direction. 'Ra' denotes an area of the conductive adhesive layer 130 in a horizontal direction, and 'h' denotes a height of the pillars 122.

The thickness (t) of the conductive adhesive layer 130 may be equal to or larger than the sum of the height (h) of the pillars 122 and the minimized distance ($t_{eff}$), and may be smaller than the sum of the 'T' of the formula and a compensation constant. The compensation constant may be a value used to compensate for an error for electrically-connecting the electrode 120 and the electrode patterns 142 to each other.

Figure 5:
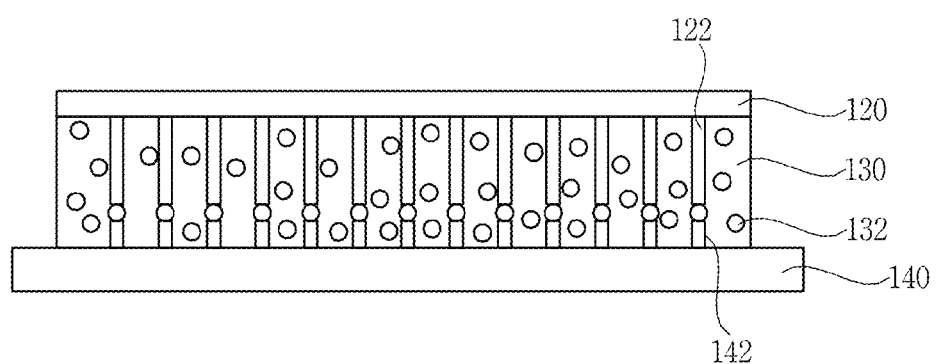
FIG. 5 is a sectional view illustrating that an electrode and electrode patterns of a semiconductor device according to an embodiment of the present invention have been electrically connected to each other.

FIG. 5 is a sectional view illustrating that an electrode and electrode patterns of a semiconductor device according to an embodiment of the present invention have been electrically connected to each other.

Referring to FIG. 5, at least one of the plurality of pillars 122 may contact the conductive substances 132. The conductive substances 132 may be implemented as balls. However, the present invention is not limited to this.

The substrate 140 may be provided with an electrode pattern 142 on an upper surface thereof. The electrode pattern 142 may be formed in plurality. Each of the electrode patterns 142 may serve to supply power, or to transmit a signal.

The electrode patterns 142 may be electrically connected to the pillars 122 by the conductive substances 132. The conductive substances 132, which are arranged between the electrode patterns 142 and the pillars 122, may serve to electrically-connect the electrode patterns 142 and the pillars 122 with each other.

FIGS. 6 to 9 are photos illustrating a connection relation of a semiconductor device according to an embodiment of the present invention.

Figure 6:
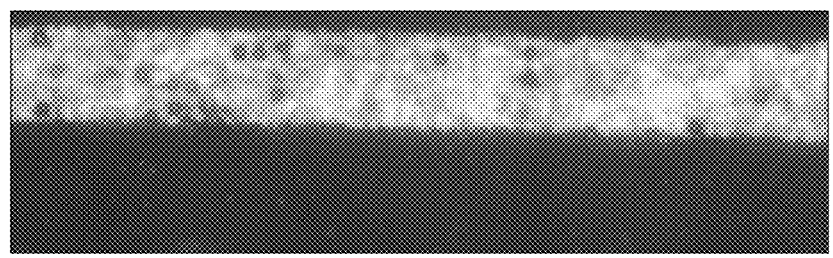
FIGS. 6 to 9 are photos illustrating a connection relation of a semiconductor device according to an embodiment of the present invention.
Figure 7:
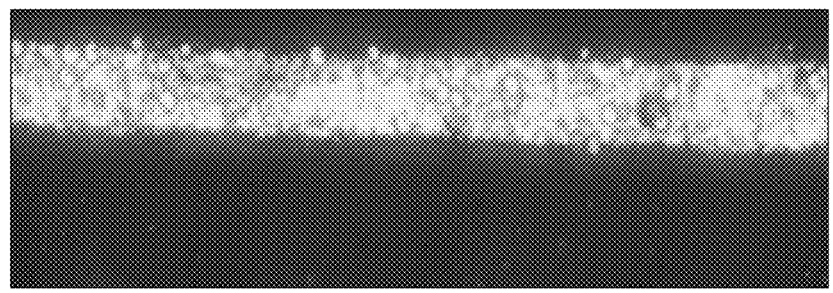
Figure 8:
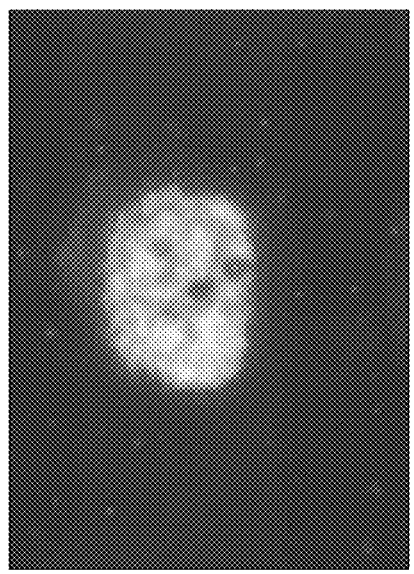
Figure 9:
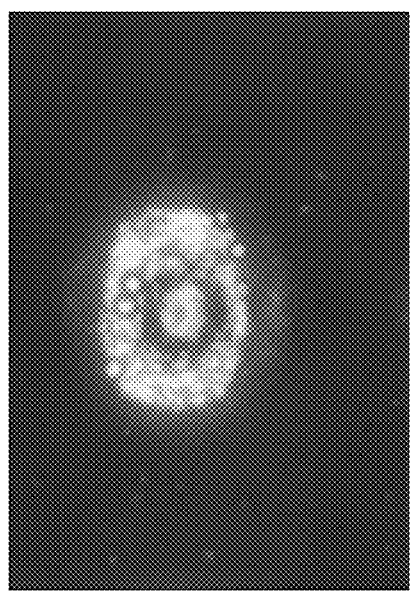

FIGS. 6 and 8 are photos illustrating an adhered state between the electrode and the conductive adhesive layer in a case where the thickness of the conductive adhesive layer has not been controlled by using the above formula, and FIGS. 7 and 9 are photos illustrating an adhered state between the electrode and the conductive adhesive layer in a case where the thickness of the conductive adhesive layer has been controlled by using the above formula.

As shown, conductive substances are arranged closer to an electrode in FIGS. 7 and 9, than in FIGS. 6 and 8.

Referring to FIGS. 7 and 9, even if the semiconductor device according to an embodiment of the present invention is provided with the conductive adhesive layer of a large area, the conductive adhesive layer and the electrode can be stably adhered to each other by controlling the thickness of the conductive adhesive layer. Even if the semiconductor device according to an embodiment of the present invention is provided with the conductive adhesive layer of a large area, the electrode and the conductive adhesive layer can be stably adhered to each other.

Figure 10:
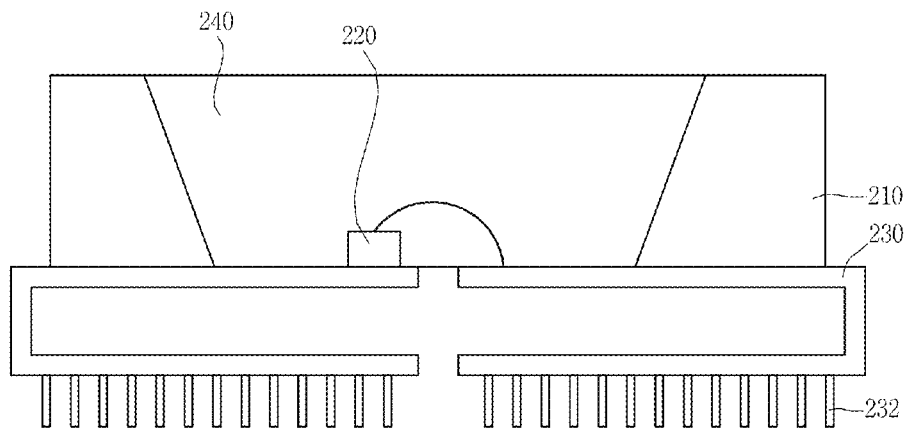
FIG. 10 is a sectional view of a light emitting diode (LED) package of a semiconductor device according to an embodiment of the present invention.

FIG. 10 is a sectional view of a light emitting diode (LED) package of a semiconductor device according to an embodiment of the present invention.

Referring to FIG. 10, the semiconductor device according to an embodiment of the present invention may be a light emitting diode.

The light emitting diode (LED) package of FIG. 10 may include a light emitting device 220, an electrode 230 electrically-connected to the light emitting device 220, a body 210 configured to enclose the electrode 230, and a sealant 240 configured to cover the light emitting device 220.

The body 210 may be formed of at least one of resin such as Polyphthalamide (PPA), silicone (Si), aluminum (Al), aluminum nitride (AlN), liquid crystal polymer (PSG, photo sensitive glass), polyamide 9T(PA9T), syndiotactic polystyrene (SPS), a metallic material, sapphire ($Al_2O_3$), beryllium oxide (BeO), a printed circuit board (PCB), a ceramic material. The body 210 may be formed by injection-molding, etching, etc. However, the present invention is not limited to this.

The body 210 may have a cavity where the light emitting device 220 is arranged. The cavity of the body 210 may have a circular shape, a quadrangular shape, a polygonal shape, an oval shape, and so on when viewed from the upper side. However, the present invention is not limited to this. That is, the cavity may have an edge of a curved line.

The light emitting device 220 may be arranged at the cavity formed by the body 210, and may be configured to emit light. The light emitting device 220 may be a light emitting diode (LED).

The light emitting device 220 may be a horizontal type where electric terminals are formed on an upper surface of the light emitting device 220, or a vertical type where electric terminals are formed on an upper surface and a lower surface of the light emitting device 220.

The light emitting device 220 may include a first semiconductor layer (not shown), an activated layer (not shown) and a second semiconductor layer (not shown). The activated layer (not shown) may be interposed between the first semiconductor layer (not shown) and the second semiconductor layer (not shown).

One of the first semiconductor layer (not shown) and the second semiconductor layer (not shown) may be a p-type semiconductor layer on which a p-type dopant has been doped, and another thereof may be an n-type semiconductor layer on which an n-type dopant has been doped. If the first semiconductor layer (not shown) is a p-type semiconductor layer, the second semiconductor layer (not shown) may be an n-type semiconductor layer, and vice versa.

The p-type semiconductor layer may be selected from materials having a composition formula of $In_xAl_yGa_{1-x-y}N$ ($0 \leq x \leq 1$, $0 \leq y \leq 1$, $0 \leq x+y \leq 1$), e.g., GaN (Gallium nitride), AlN (Aluminum nitride), AlGaN (Aluminum gallium nitride), InGaN (Indium gallium nitride), InN (Indium nitride), InAlGaN, AlInN, etc. A p-type dopant, such as magnesium (Mg), zinc (Zn), calcium (Ca), strontium (Sr) and barium (Ba), may be doped on the p-type semiconductor layer.

The n-type semiconductor layer may be selected from materials having a composition formula of $In_xAl_yGa_{1-x-y}N$ ($0 \leq x \leq 1$, $0 \leq y \leq 1$, $0 \leq x+y \leq 1$), e.g., GaN (Gallium nitride), AlN (Aluminum nitride), AlGaN (Aluminum gallium nitride), InGaN (Indium gallium nitride), InN (Indium nitride), InAlGaN, AlInN, etc. An n-type dopant, such as silicone (Si), germanium (Ge), tin (Sn), selenium (Se) and tellurium (Te), may be doped on the n-type semiconductor layer.

An activated layer (not shown) may be interposed between a first semiconductor layer (not shown) and a second semiconductor layer (not shown). The activated layer (not shown) may be formed to have a single or multiple quantum well structure, a quantum wire structure, or a quantum dot structure, using a semiconductor material selected from third to fifth group of compounds.

In a case where the activated layer (not shown) has a quantum well structure, the activated layer may have a single well structure including a well layer having a composition formula of $In_xAl_yGa_{1-x-y}N$ ($0 \leq x \leq 1$, $0 \leq y \leq 1$, $0 \leq x+y \leq 1$), and a barrier layer having a composition formula of $In_aAl_bGa_{1-a-b}N$ ($0 \leq x \leq 1$, $0 \leq y \leq 1$, $0 \leq x+y \leq 1$). The well layer may be formed of a material having a band gap smaller than that of the barrier layer.

A conductive clad layer (not shown) may be formed above or below the activated layer (not shown). The conductive clad layer (not shown) may be configured as an AlGaN-based semiconductor device, and may have a band gap larger than that of the activated layer (not shown).

The sealant 240 may be filled in the cavity, and may include a fluorescent substance (not shown). The sealant 240 may be formed of transparent silicone, epoxy, or resin. After being filled in the cavity, the sealant 240 may be hardened by ultraviolet rays or heat.

The electrode 230 may be arranged at one region of the body 110. For instance, the body 210 may be formed to enclose one region of the electrode 230, thereby fixing the electrode 230.

The electrode 230 may be electrically-connected to the light emitting device 220. The electrode 230 may be formed in two having different electric polarities. The two electrodes 230 having different electric polarities may be connected to two electrodes of the light emitting device 220, respectively. The electrode 230 may be configured to supply power to the light emitting device 220.

The electrodes 230 may include a plurality of pillars 232 having the same length. The plurality of pillars 232 may be integrally formed with the electrodes 230. Alternatively, the plurality of pillars 232 may be separately formed from the electrodes 230, and then may be adhered to the electrodes 230. However, the present invention is not limited to this.

Figure 11:
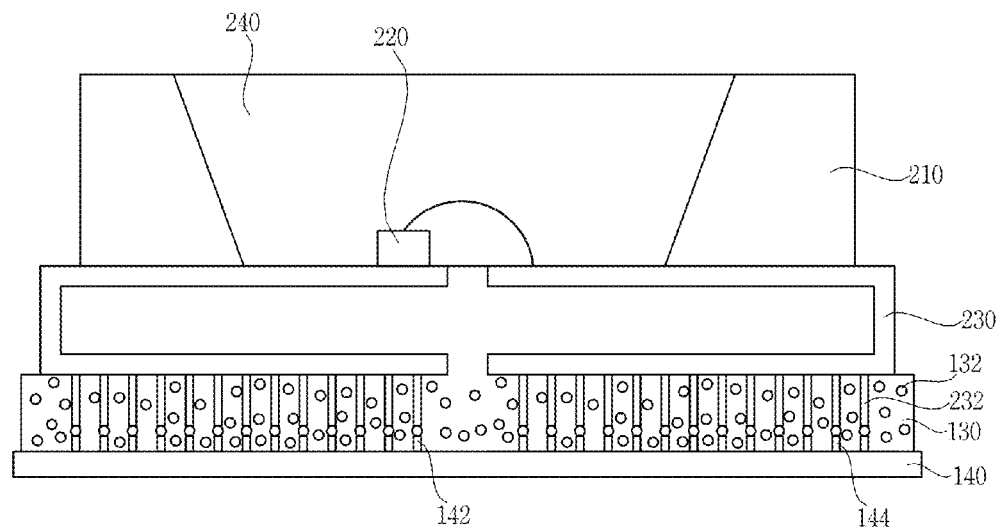
FIG. 11 is a sectional view of a semiconductor device according to an embodiment of the present invention.

FIG. 11 is a sectional view of a semiconductor device according to an embodiment of the present invention.

Referring to FIG. 11, the semiconductor device according to an embodiment of the present invention may be provided with an electrode pattern 142 on an upper surface of a substrate 140. The electrode pattern 142 may be formed in plurality. Each of the plurality of electrode patterns 142 may serve to supply power or to transmit a signal.

The electrode patterns may be electrode patterns 142 and 144 having different electric polarities. The electrode 230 of the light emitting diode (LED) package may be two electrodes 230 having different electric polarities. The plurality of electrode patterns and the plurality of LED packages may be connected to each other by the conductive substances 132 for the same polarity.

The plurality of electrode patterns 142 may be electrically-connected to the plurality of pillars 232 by the conductive substances 132. The conductive substances 132 may be arranged between the plurality of electrode patterns 142 and the plurality of pillars 232, thereby electrically-connecting the electrode patterns 142 and 144 to the pillars 232.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A semiconductor device, comprising:
   a semiconductor including a plurality of pillars;
   an electrode including a plurality of pillars;
   a semiconductor element having electrodes and electrically-connected with the electrode;
   a substrate having electrode patterns; and
   a conductive adhesive layer located between the substrate and the electrode, the conductive adhesive layer including conductive substances electrically connecting the pillars and the electrode patterns to each other, and including a body which encloses the conductive substances,
   wherein the electrode is connected to one of the electrodes included in the semiconductor element,
   wherein the plurality of pillars are sequentially disposed in rows and columns at a single surface of the electrode, and inserted into the conductive adhesive layer, and
   wherein the electrode patterns are protruded from the substrate so as to face the pillars and inserted into the conductive adhesive layer.

2. The semiconductor device of claim 1, wherein a thickness of the conductive adhesive layer is the sum of a height of the pillars and a minimized distance for electrically-connecting the pillars and the electrode patterns to each other.

3. The semiconductor device of claim 1, wherein a width of the conductive adhesive layer is within a range of 1 cm to 6 cm.

4. The semiconductor device of claim 1, wherein the body of the conductive adhesive layer encloses the plurality of pillars.

5. The semiconductor device of claim 1, wherein at least one of the plurality of pillars contacts the conductive substances.

6. The semiconductor device of claim 1, wherein the plurality of pillars have a same distance therebetween.

7. The semiconductor device of claim 1, wherein a thickness of the conductive adhesive layer is obtained by the following formula:

$$T=(1-(Ea/Ra))*h$$

where 'T' denotes a thickness of the conductive adhesive layer, 'Ea' denotes an area of the pillars in a horizontal direction, 'Ra' denotes an area of the conductive adhesive layer in a horizontal direction, and 'h' denotes a height of the pillars.

8. The semiconductor device of claim 1, wherein each of the plurality of pillars has a same volume.

9. The semiconductor device of claim 1, wherein the semiconductor element is a light emitting diode for emitting light.

10. The semiconductor device of claim 1, wherein the electrode patterns are protruded from the substrate to form pillars shorter than the pillars of the electrode.

11. The semiconductor device of claim 1, wherein distal ends of the pillars face the electrode patterns without touching the electrode patterns, and
   wherein the conductive substances of the conductive adhesive layer are interposed between the distal ends of the pillars and the electrode patterns.

12. The semiconductor device of claim 1, wherein the electrode patterns and the pillars, which are electrically-connected to each other by the conductive substances, are disposed to face each other.

13. An electrical device, comprising:
   an electrode having a plurality of pillars extending therefrom;
   a substrate having a plurality of electrode patterns extending therefrom; and
   a conductive adhesive layer interposed between the electrode and the substrate, the conductive adhesive layer comprising an adhesive base portion and conductive substances interspersed throughout the adhesive base portion, wherein the pillars and the electrode patterns each extend into the conductive adhesive layer, wherein the pillars and the electrode patterns are electrically interconnected with one another by the conductive substances of the conductive adhesive layer, wherein the electrode is connected to one of electrodes included in a light emitting diode, wherein the plurality of pillars are sequentially disposed in rows and columns at a single surface of the electrode, and inserted into the conductive adhesive layer, and wherein the electrode patterns are protruded from the substrate so as to face the pillars and inserted into the conductive adhesive layer.

14. The electrical device of claim 13, wherein the electrode pattern comprises a pillar shorter than the pillars of the electrode.

15. A light emitting device package, comprising:
a light emitting device, the light emitting device including an electrode having a plurality of pillars extending therefrom;
a substrate having a plurality of electrode patterns extending therefrom; and
a conductive adhesive layer interposed between the electrode and the substrate, the conductive adhesive layer comprising an adhesive base portion and conductive substances interspersed throughout the adhesive base portion, wherein the pillars and the electrode patterns each extend into the conductive adhesive layer, wherein the pillars and the electrode patterns are electrically interconnected with one another by the conductive substances of the conductive adhesive layer, wherein the electrode is connected to one of electrodes included in a light emitting diode, wherein the plurality of pillars are sequentially disposed in rows and columns at a single surface of the electrode, and inserted into the conductive adhesive layer, and wherein the electrode patterns are protruded from the substrate so as to face the pillars and inserted into the conductive adhesive layer.

16. The light emitting device package of claim 15, wherein distal ends of the pillars face the electrode pattern without touching the electrode pattern, and wherein the conductive substances of the conductive adhesive layer are interposed between the distal ends of the pillars and the electrode pattern.

* * * * *